(12) United States Patent
Tanisaka

(10) Patent No.: US 10,490,973 B2
(45) Date of Patent: Nov. 26, 2019

(54) METHOD OF MANUFACTURING LIGHT EMITTING DEVICE

(71) Applicant: NICHIA CORPORATION, Anan-shi, Tokushima (JP)

(72) Inventor: Shingo Tanisaka, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/112,036

(22) Filed: Aug. 24, 2018

(65) Prior Publication Data

US 2019/0067902 A1 Feb. 28, 2019

(30) Foreign Application Priority Data

Aug. 30, 2017 (JP) ................. 2017-165760

(51) Int. Cl.
| | |
|---|---|
| *H01S 5/024* | (2006.01) |
| *H01S 5/02* | (2006.01) |
| *H01S 5/022* | (2006.01) |
| *H01S 5/042* | (2006.01) |
| *H01S 5/22* | (2006.01) |
| *H01S 5/323* | (2006.01) |

(52) U.S. Cl.
CPC ........ *H01S 5/02469* (2013.01); *H01S 5/0215* (2013.01); *H01S 5/0224* (2013.01); *H01S 5/02476* (2013.01); *H01S 5/0425* (2013.01); *H01S 5/0202* (2013.01); *H01S 5/0217* (2013.01); *H01S 5/02256* (2013.01); *H01S 5/02272* (2013.01); *H01S 5/22* (2013.01); *H01S 5/32341* (2013.01); *H01S 2301/176* (2013.01)

(58) Field of Classification Search
CPC combination set(s) only.
See application file for complete search history.

(56) References Cited

U.S. PATENT DOCUMENTS

| | | | |
|---|---|---|---|
| 2002/0142503 A1 | 10/2002 | Miyachi et al. | |
| 2004/0121499 A1 | 6/2004 | Miyachi et al. | |
| 2008/0267238 A1* | 10/2008 | Takeuchi | B82Y 20/00 372/46.012 |
| 2018/0358509 A1* | 12/2018 | Huppmann | H01L 33/0079 |

FOREIGN PATENT DOCUMENTS

| | | |
|---|---|---|
| JP | 2002-299739 A | 10/2002 |
| JP | 2008-294421 A | 12/2008 |
| JP | 2009-123939 A | 6/2009 |

\* cited by examiner

*Primary Examiner* — Ratisha Mehta
(74) *Attorney, Agent, or Firm* — Global IP Counselors, LLP

(57) ABSTRACT

A method of manufacturing a light emitting device includes providing an element-structure wafer that includes a first substrate and a laser element structure on the first substrate, bonding a laser element structure side of the element-structure wafer to a second substrate to obtain a bonded wafer, removing at least a portion of the first substrate to obtain a thinned bonded wafer, singulating the thinned bonded wafer to obtain a laser element with the second substrate, mounting the laser element with the second substrate on a heat dissipating member such that a laser element structure side of the laser element with the second substrate faces the heat dissipating member, and removing the second substrate from the laser element.

18 Claims, 11 Drawing Sheets

13 31a 13  31b 13 31d

METHOD OF MANUFACTURING LIGHT EMITTING DEVICE

CROSS-REFERENCE TO RELATED PATENT APPLICATIONS

This application claims priority to Japanese Patent Application No. 2017-165760 filed on Aug. 30, 2017. The entire disclosure of Japanese Patent Application No. 2017-165760 is hereby incorporated herein by reference.

BACKGROUND

The present disclosure relates to a method of manufacturing a light emitting device.

In formation of semiconductor lasers, semiconductor layers are formed on a growth substrate. For various purposes, a technique may be employed in which a wafer in which the semiconductor layers are formed is bonded to a support substrate and then the growth substrate is removed.

For example, a technique in which, for the purpose of improving cleavability, semiconductor layers are bonded to a support substrate having a better cleavability and then a growth substrate is removed (e.g., JP 2002-299739 A), and a technique in which, for the purpose of preventing generation of a crack due to difference in thickness of the semiconductor layers, semiconductor layers are bonded to a support substrate with stepped portions and then a growth substrate is removed (JP 2009-123939 A) are proposed.

SUMMARY

Because the higher the output of a semiconductor laser, the greater the amount of generated heat, further improvement in heat dissipation performance is required. Further, semiconductor lasers with higher efficiency are required.

One object of the present invention is to provide a method of manufacturing a light emitting device that allows for achieving improvement in heat dissipation performance and increase in efficiency of the light emitting device.

According to certain embodiments of the present invention, a method of manufacturing a light emitting device includes: providing an element-structure wafer having a first substrate and a laser element structure on the first substrate; bonding a laser element structure side of the element-structure wafer to a second substrate to obtain a bonded wafer; removing at least a portion of the first substrate to obtain a thinned bonded wafer; singulating the thinned bonded wafer to obtain a laser element with the second substrate; mounting the laser element with the second substrate on a heat dissipating member such that a laser element side of the laser element with the second substrate faces the heat dissipating member; and removing the second substrate from the laser element.

According to certain embodiments of the present invention, a method of manufacturing a light emitting device having higher heat dissipation performance and higher efficiency can be provided.

DETAILED DESCRIPTION

Figure 1A:
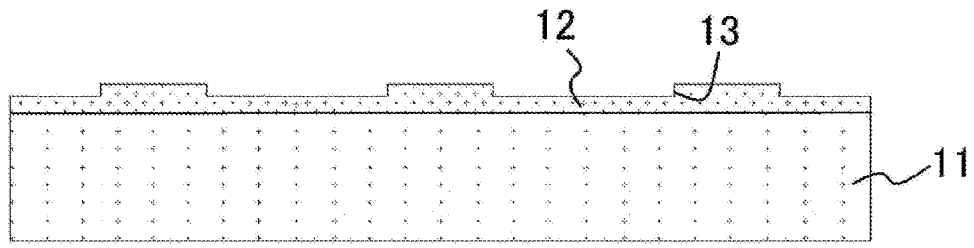
FIG. 1A is a schematic cross-sectional view illustrating a method of manufacturing a light emitting device according to a first embodiment.

The embodiments shown below are intended as illustrative to give a concrete form to technical ideas of the present invention, and the scope of the invention is not limited to those described below. The sizes and the positional relationships of the members in each of the drawings are occasionally shown exaggerated for ease of explanation. Further, in the description below, the same designations or the same reference numerals denote the same or like members and duplicative descriptions will be appropriately omitted.

First Embodiment

A method of manufacturing a light emitting device according to a first embodiment includes, as shown in FIGS. 1A to 1J, providing an element-structure wafer including a first substrate and a laser element structure on the first substrate, bonding a laser element structure side of the element-structure wafer to a second substrate to obtain a bonded wafer, removing at least a portion of the first substrate to thin the bonded wafer, singulating the thinned bonded wafer to obtain a laser element with the second substrate, mounting the laser element with the second substrate on the heat dissipating member such that a laser element structure side of the laser element with the second substrate faces the heat dissipating member, and removing the second substrate from the laser element.

In this manner, the second substrate is bonded for reinforcement, which allows for thinning a wafer that includes the first substrate on which the laser element structure is formed. Further, mounting the laser element structure on the heat dissipating member allows a light-emitting portion (i.e., active layer) of the laser element, which is a heat source, to be located closer to the heat dissipating member. Thus, heat can be easily released from the laser element to the heat dissipating member, so that heat resistance of the light emitting device can be reduced. Mounting in a junction-down manner also allows a light emitting portion of a laser element to be located closer to the heat dissipating member, but when mounting in junction-down manner, a material having a relatively high heat resistance such as an insulating layer is disposed between the light emitting portion of the laser element and the heat dissipating member. According to the method of manufacturing the light emitting device according to the first embodiment, a material having a relatively high heat resistance such as an insulating film is not necessarily disposed between the light emitting portion and the heat dissipating member, so that beat resistance of the light emitting device can be further reduced compared to the case where the laser element is mounted in, a junction-down manner.

Further, thinning the wafer that includes the first substrate and removing the second substrate after mounting the laser element structure on the heat dissipating member allows for reducing electric resistance attributed to electric resistances of the first substrate and second substrate can be reduced. Accordingly, a driving voltage of the laser element can be reduced. Thus, further increase in efficiency of the laser element can be achieved. Further, because the second substrate is removed, an inexpensive material can be used for the second substrate irrespective of an electric resistance thereof.

Providing Wafer

The element-structure wafer including the first substrate and the laser element structure on the first substrate is provided.

As shown in FIG. 1A, a semiconductor layered structure 12 is formed as a laser element structure on a first substrate 11.

Examples of the first substrate 11 include a compound semiconductor substrate such as a GaN substrate, a GaAs substrate, an element semiconductor substrate such as a silicone substrate, and an insulating substrate such as a sapphire substrate. Among these, a conductive substrate is preferable, and a crystalline substrate having cleavability is more preferable. The expression "having cleavability" as used herein refers to having an easy-cleavage plane, along which cleaving can be easily performed. For example, when the first substrate 11 is a GaN substrate, the {1-100} plane, which is an m-plane, is an easy-cleavage plane. In this case, the element structure is preferably formed so that a plane perpendicular to the m-plane, that is, {0001} plane, which is a c-plane, is a main surface. At this stage, the first substrate 11 has a thickness in a range of, for example, 50 μm to 2 mm. A surface of the first substrate may include irregularities, or may have an off angle of, for example, 1 degree or less.

The semiconductor layered structure 12 includes, for example, an n-side semiconductor layer, an active layer, and a p-side semiconductor layer in order from a first substrate 11 side. The n-side semiconductor layer and the p-side semiconductor layer include an n-type semiconductor layer and a p-type semiconductor layer, respectively, and each of the n-side semiconductor layer and the p-side semiconductor layer may include an undoped layer. The active layer includes, for example, a multi quantum well structure or a single quantum well structure. The semiconductor layered structure 12 can be formed by performing epitaxially growth on the first substrate 11. Examples of a material of the semiconductor layered structure 12 include Group III-V compound semiconductor such as a GaN-based semiconductor, a GaP-based semiconductor, and a GaAs-based semiconductor. For example, a nitride semiconductor represented by a general formula $In_XAl_YGa_{1-X-Y}N$ ($0 \leq X$, $0 \leq Y$, $X+Y \leq 1$) can be used for the semiconductor layered structure 12.

As shown in FIG. 1A, in the semiconductor layered structure 12, optical waveguides are formed using a known technique. For example, using photolithography or an etching technique, portions of an upper surface-side of the semiconductor layered structure 12, which may be portions of the p-side semiconductor layer, are removed to form stripe-shaped ridges 13, which serve as optical waveguides. In this manner, in the laser element structure, the ridges 13 can be formed at a side opposite to the first substrate 11.

A metal layer (a first metal layer) is preferably formed on an upper surface of the laser element structure. For example, the metal layer (the first metal layer) may be disposed as an uppermost layer of each of upper-surface electrodes disposed on corresponding portions of the upper surface of the p-side semiconductor layer. The first metal layer can facilitate bonding to a metal layer 18 (second metal layer 18) of the second, substrate, which will be described below. In order to facilitate bonding to the second substrate described below, the first metal layer is preferably made of gold. Further, after removing the second substrate described below, the first metal layer will also serve as an uppermost layer, on which wire-bonding will be preformed. Accordingly, also in view of adhesion with a wire, the first metal layer is preferably made of gold.

Figure 1B:
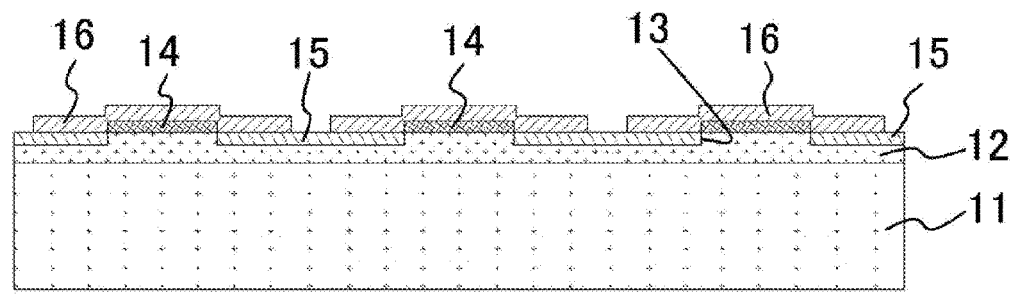
FIG. 1B is a schematic cross-sectional view illustrating the method of manufacturing the light emitting device according to the first embodiment.

The upper-surface electrodes are electrically connected to the p-side semiconductor layer. As shown in FIG. 1B, examples of the upper-surface electrodes include structures each including a first p-electrode 14 in contact with the upper surface of the p-side semiconductor layer, and a second p-electrode 16 (i.e., the metal layer (first metal layer) of the element-structure wafer), which is a pad electrode disposed on the first p-electrode 14 for external connection. Each of the first p-electrodes 14 is preferably disposed on a portion of the p-side semiconductor layer corresponding to a respective one of the optical waveguides, and may be disposed only on an upper surface of a respective one of the ridges 13. Each of the second p-electrodes 16 may be disposed only on a respective one of the ridges 13, or may be disposed over the respective one of the ridges 13 and the upper surface of the p-side semiconductor layer.

The upper-surface electrodes can be made of, for example, a single-layer film or a layered film of a metal such as palladium, platinum, nickel, gold, titanium, tungsten, copper, silver, zinc, tin, indium, chromium, aluminum, iridium, rhodium or an alloy of two or more of these metals.

Each of the upper-surface electrodes may be made of a layered film of a conductive oxide film such as ITO and a metal film layered in order from a semiconductor layered structure 12 side.

The first p-electrodes 14 have a thickness in a range of, for example, 10 nm to 1000 nm. The second p-electrodes 16 have a thickness in a range of, for example, 100 run to 1 µm.

It is preferable that, before or after forming the upper-surface electrodes, an insulating film 15 is disposed on regions of the p-side semiconductor layer, except for regions where the upper-surface electrodes and a semiconductor layer are to be in contact with each other. For example, an insulating layer 15 is preferably disposed on portions of the upper surface of the p-side semiconductor layer, such as portions between the ridges 13 and on the lateral surfaces of ridges 13, except for the upper surface of each of the ridges 13. In the case where a nitride semiconductor is used for the laser element structure, forming the ridges 13 on an upper surface of the element structure and forming, the insulating films 15 having a relatively low refractive index in regions except for the ridges 13 allow a light to be efficiently confined in the optical wave guide. The insulating films 15 can be made of an insulating film of an oxide, a nitride, an oxynitride, or the like of Zr, Si, V, Nb, Hf, Ta, Al, Ce, In, Sb, Zn, etc. The difference between a refractive index of the insulating films 15, which is relatively low, and a refractive index of a semiconductor layer (e.g., GaN) is preferably greater. Examples of such a material include $SiO_2$. The insulating films 15 have a thickness in a range of, for example, 100 nm to 1500 nm.

In a laser element using a nitride semiconductor, materials of relatively high heat resistance, such as an oxide film, may be used for electrodes and/or insulating films. When mounted in a junction-down manner, such a material with relatively high heat resistance is located between the laser element and a heat dissipating member such as a submount, impeding heat dissipation. In view of this, mounting the laser element on the heat dissipating member with a lower-surface electrode side (i.e., n-electrode side) of the laser element facing the heat dissipation member can reduce the heat resistance of the light emitting device compared to mounting in a junction-down manner.

Figure 3A:
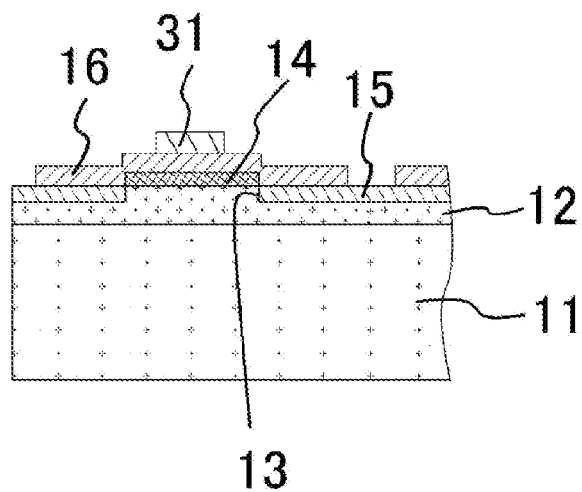
FIG. 3A is a schematic partial cross-sectional view showing a partial modification in a structure of a laser device according to the first embodiment.
Figure 3B:
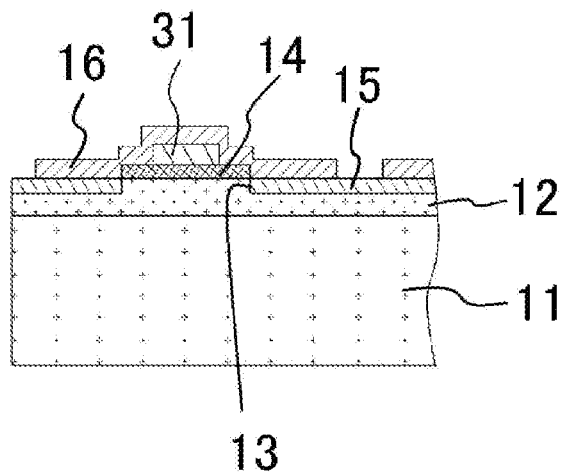
FIG. 3B is a schematic cross-sectional view showing another partial modification in a structure of the laser device according to the First embodiment.
Figure 3C:
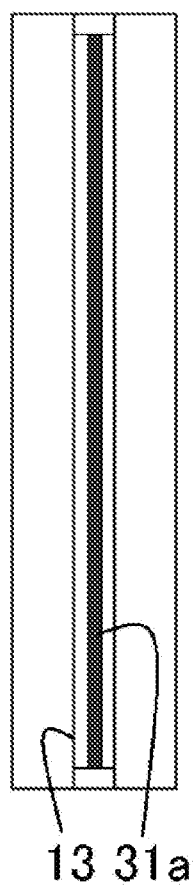
FIG. 3C is a schematic plan view showing even another partial modification in a structure of the laser device according to the first embodiment.
Figure 3D:
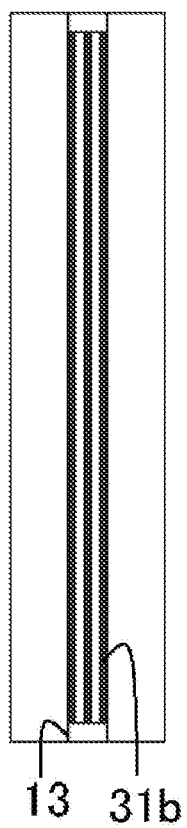
FIG. 3D is a schematic plan view showing yet another partial modification in a structure of the laser device according to the first embodiment.
Figure 3E:
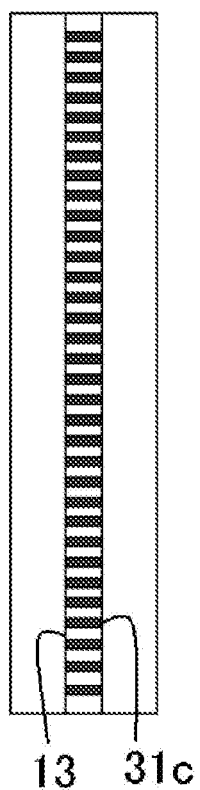
FIG. 3E is a schematic plan view showing still another partial modification a structure of the laser device according to the first embodiment.
Figure 3F:
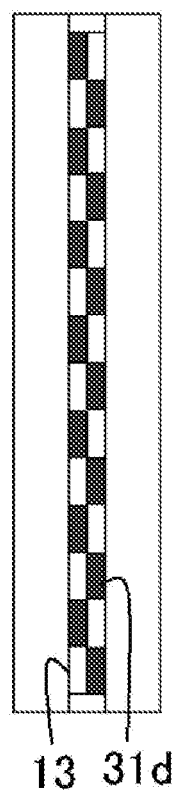
FIG. 3F is a schematic plan view showing further another partial modification in a structure of the laser device according to the first embodiment.

As shown in FIG. 3A, a raising layer 31 subjected to an appropriate patterning may be further formed above each of the ridges 13. The raising layer 31 may be alternatively formed, for example, between the first p-electrode 14 and the second p-electrode 16, as shown in FIG. 3B. With this arrangement, an upper surface of each of the second p-electrodes 16 below which a respective one of the raising layers 31 is disposed can be located highest of the wafer, which will be bonded to the second substrate at the time of bonding to the second substrate described below. Accordingly, the bonding area between the wafer and the second substrate can be adjusted with the area of the raising layer 31 in a plan view, that is, bonding strength between the wafer and the second substrate can thereby be adjusted. In order to obtain a laser element of high output, increasing the width of each of the ridges 13 can be effective. Meanwhile, the greater the width of each of the ridges 13, the larger the bonding area between each of the ridges 13 and the second substrate is, which may lead to difficulty in removing the second substrate in a later step. However, the bonding area can be adjusted by providing the raising layers 31. For this purpose, in a plan view, the total area of the raising layer 31 is preferably smaller than the area of the corresponding each of the ridges 13. The ridges 13 that are preferably provided with the raising layers 31 have a width of 30 µm or greater, and 50 µm or greater.

The raising layers 31 may have a plan view shape of a rectangular shape, a circular shape, an elliptic shape, or a complex, shape of two or more of these. Each of the raising layer 31 may be disposed over an entire region between a portion to be a light-emission end surface and a light-reflection end surface, or may be disposed spaced apart from the light-emission end surface and/or the light-emission end surface. Examples of the plan view shape of each of the raising layers 31 are shown in FIGS. 3C to 3F. Regions shaded in black in FIGS. 3C to 3F indicate the raising layer 31a, 31b, 31c, and 31d, respectively.

Examples of a material of the raising layers 31 include an insulating material such as an oxide, and a conductive material such as a metal. When made of a conductive material, the raising layers 31 can be used as a part of a current path between the semiconductor layered structure 12 and a wire or the like, that is, can be used as a part of each of the upper-surface electrodes, increasing the degree of freedom in arrangement of the raising layers 31 at desired locations. For example, a metal with a low electric resistance such as Au can be used for a main material of the raising layers 31. The raising layers 31 preferably have a thickness of 10 nm or more, more preferably 50 nm or more so as to allow adjustment of the bonding area. Further, for example, in the case where a plurality of raising layers is disposed above a single ridge 13, if the raising layers have a too large thickness, dusts may remain at regions between the plurality of raising layers. In view of this, the raising layers preferably have a thickness of 200 nm or less, more preferably 100 nm or less.

Each of the raising layer 31 may be disposed on a respective one of the second p-electrodes 12 as shown in FIG. 3A. In this case, a surface of each of the raising layers 31, serves as a surface bonded with the second substrate and serves as a wire-bonded surface. Accordingly, in this case, the raising layers 31 serves as the first metal layer described above. Further, each of the raising layers 31 is preferably the first metal layer made of gold. Each of the raising layers 31 may have a layered structure, and an uppermost layer of the layered structure may be the first metal layer made of gold. In the case where an area greater than an area of a surface of each of the raising layers is required for wire bonding, a portion of surface of each of the second, p-electrodes exposed from the raising layer 31 can be used as a wire-bonded surface.

Further, even disposing each of the raising layers 31 below a respective one of the first p-electrodes 14 allows for adjusting the bonding area, but the raising layers 31 below the first p-electrodes 14 may interrupt electric current between the first p-electrodes 14 and the semiconductor layered structure 12. Thus, the raising layers 31 are preferably disposed on or above the first p-electrodes 14.

Bonding Wafer to Second Substrate

Figure 1C:
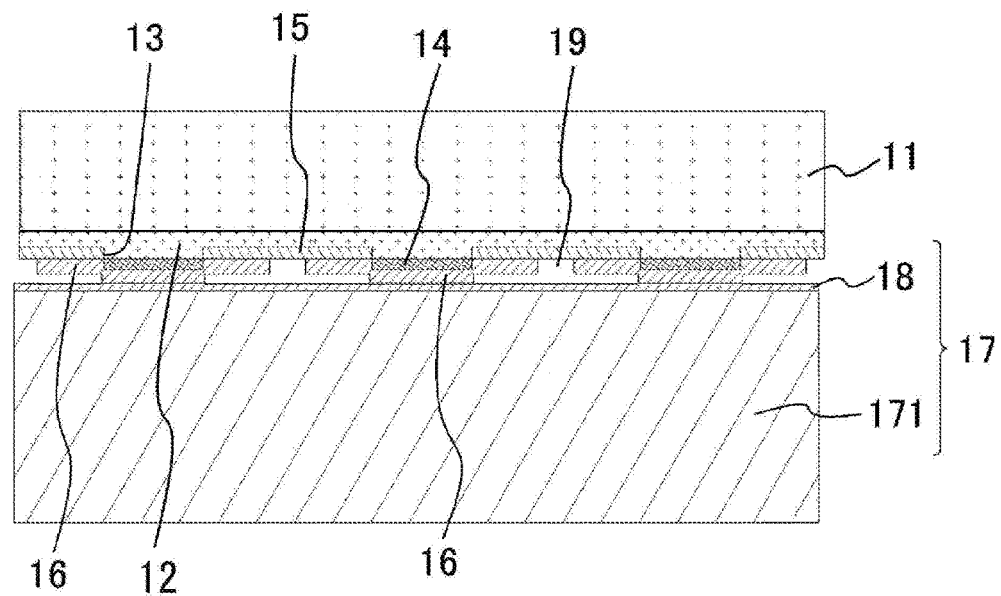
FIG. 1C is a schematic cross-sectional view illustrating the method of manufacturing the light emitting device according to the first embodiment.

As shown in FIG. 1C, a laser element structure side of the element-structure wafer is bonded to the second substrate 17.

The second substrate 17 bonded to the laser element structure is preferably a substrate that can be cleaved together with the first substrate 11 and/or the laser element structure. Accordingly, the second substrate 17 is preferably made of a material having cleavability. That is the second substrate 17 is preferably a crystalline substrate including an easy-cleavage plane. As used herein, the expression "easy-cleavage plane" refers to a plane along which cleavage easily occur in a specific direction along a crystal plane. Examples of the second substrate 17 include an Si substrate and a GaAs substrate. In view of manufacturing the laser element at a low cost, an Si substrate is preferable. For example, an Si substrate having a main surface of a (100) plane or a (110) plane can be used.

The second substrate 17 preferably includes the second metal layer 18 on at least one surface thereof that is opposite to the laser element structure. The second metal layer 18 can be made of, for example, a single-layer film or a layered film of a metal such as palladium, platinum, nickel, gold, titanium, tungsten, copper, silver, zinc, tin, indium, chromium, aluminum, iridium, rhodium or an alloy of two or more of these metals. Among those, in order to facilitate bonding, a material used for an uppermost surface of the metal later 18 is preferably the same material used for an uppermost surface of each of the upper-surface electrodes of the laser element structure, and is more preferably gold. The second metal layer 18 can be disposed on a main surface of a main body 171 of the second substrate 17. In this case, the main body 171 is preferably made of a material having cleavability as described above, that is, a material such as Si or GaAs. In the present specification, the expression "second substrate 17 (or 17a) has cleavability" refers to that, when the second substrate 17 (or 17a) includes the second metal layer 18, the main body 171 (or 171a) has cleavability.

In view of securing strength, the second substrate 17 has a thickness greater than a thickness of the first substrate after thinning the wafer as described below. The second substrate 17 preferably has a thickness that allows for reducing influence of warpage caused by removing at least a portion of the first substrate 17. For example, the second substrate 17 has a thickness in a range of 300 µm to 5 mm, preferably in a range of 300 µm to 500 µm.

As shown in FIG. 1C, the second p-electrodes 16, each of which is a part of a respective one of the upper-surface electrodes on the upper surface of the laser element structure, are placed facing the second metal layer 18 of the second substrate 17 and the sect p-electrodes 16 and the metal layer 18 are connected to each other. Thus, the laser element structure and the second substrate 17 are bonded. At this time, the first substrate 11 and the second substrate 17 are bonded to each other such that a line parallel to an easy-cleavage plane of the first substrate 11 and a line parallel to an easy-cleavage plane of the second substrate 17 are parallel to each other when viewed from a laser element structure side or a second substrate 17 side. With such a bonding, cleaving of the second substrate 17 and cleaving of the first substrate 11 can be performed at once, so that singulation can be performed even in the case where the first substrate 11 is thinned to the extent that it is difficult to form a groove or the like for cleavage, which will be described below, in the first substrate 11. Similarly, a line parallel to an easy-cleavage plane of the laser element structure is preferably parallel to an easy-cleavage plane of the first substrate 11 and an easy-cleavage plane of the second substrate 17. Because resonator end surfaces of a laser element are preferably formed by cleaving, alignment is preferably performed such that surfaces obtained by cleavage along an easy-cleavage plane become resonator end surfaces. For example, in the case where each of the first substrate 11 and the laser element structure is made of a GaN-based semiconductor and is cleaved along an m-plane thereof to obtain resonator end surfaces, it is preferable that the second substrate 17 is an Si substrate with a main surface of a (100) plane and bonding is performed at a position that allows a line parallel to the (−110) plane to be parallel to the m-plane of the laser element structure or the like so that cleaving can be performed along the (−110) plane. The expression "a line parallel to an easy-cleavage plane of the first substrate 11 and a line parallel to an easy-cleavage plane of the second substrate 17 are parallel to each other" refers to that the line parallel to the easy-cleavage plane of the first substrate 11 and the line parallel to the easy-cleavage plane of the second substrate 17 are parallel to each other to the extent that the second substrate 7 can be cleaved together with the first substrate 11 at once. For example, a deviation of about ±0.2 degrees is tolerated.

Accordingly, it is preferable that a GaN substrate is used for the first substrate 11 and an Si substrate is used for the second substrate 17. In this case, in particular, a nitride semiconductor layer is used for the semiconductor layers of the laser element structure.

A solid diffusion bonding technique, a heat-pressure bonding technique, or the like, can be employed as a method of the bonding, and in consideration of physical separation to be performed later, a bonding technique that allows for maintaining a bonding interface is preferably employed. For example, a metal bonding technique in which metals are placed adjacent to each other and pressed toward the interface between the metals (bonding temperature: 200° C. to 300° C., force: 3 kN to 10 kN, duration: 5 minutes to 15 minutes) is preferably employed. At a temperature of greater than 300° C., electrodes or the like of the laser element structure may be degraded. In view of this, a bonding temperature is preferably 300° C. or less. An area for the contact surface between the first substrate 11 and the second substrate 17 for the bonding is preferably as small as possible. In the case where the element-structure wafer includes the ridges 13, it is preferable that the element-structure water and the second substrate 17 are bonded at portions where the ridges 3 are formed in a plan view, and are not bonded with each other at portions other than the portions where the ridges 3 are formed in a plan view. This allows for facilitating physical separation that will be performed later. More specifically, as shown in FIG. 1C, the element-structure wafer and the second substrate 17 are preferably connected such that, the second p-electrodes 16, which are the uppermost surfaces of the upper-surface electrodes on the ridges 13 of the first substrate 11, and the second metal layer 18, which is an upper surface of the second substrate 17 are bonded, and thus gaps 19 are formed between the element-structure wafer and the second substrate 17 at other locations.

Meanwhile, for example, when the first metal layer is not formed as the outermost surface of the laser element structure, and/or the second metal layer 18 is not formed as the outermost surface of the second substrate 17, a material other than a metal (for example, an insulating film, a resin layer, or the like) and a metal film or a material other than a metal are placed opposite to each other, and rare bonded using a technique that allows for maintaining a bonding interface, as in the bonding between metals as described above.

In the laser element structure, the first substrate 11, and the second substrate 17, a metal layer such as an electrode is preferably absent at portions to be divided in singulation, which will be described below. In particular, the upper-surface electrodes, lower surface electrodes, which will be described below, and the metal layer are preferably absent at portions to be cut for formation of the resonator end surfaces.

Thinning Wafer

Figure 1D:
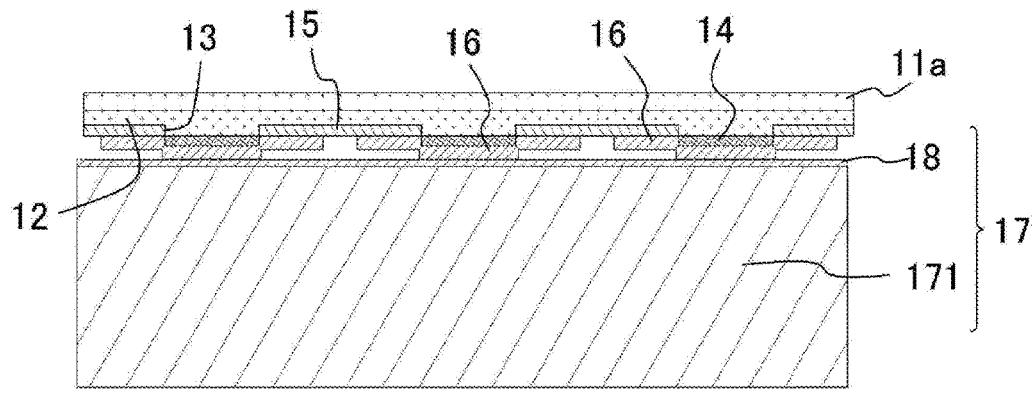
FIG. 1D is a schematic cross-sectional view illustrating the method of manufacturing the light emitting device according to the first embodiment.

As shown in FIG. 1D, at least a portion of the first substrate 11 is removed from a lower side to thin the bonded wafer. The first substrate 11 may be removed completely. With the second substrate 17 bonded to the element structure wafer, the bonded wafer can be thinned in this manner. It is preferable that the removing is performed by polishing and/or a dry-etching. Chemical mechanical polishing (CMP) and/or dry etching (e.g., RIE) may be performed in combination to complete a mechanical polishing. When a polishing is performed, in order to reduce influence of warpage of the wafer, it is preferable that at least a portion of the first substrate 11 is removed in a state where a second substrate 17 side of the wafer is temporally affixed to a temporal substrate having a thickness greater than a thickness of the second substrate 17. Examples of a material of the temporal substrate include a sapphire substrate, and the temporal substrate has a thickness of, for example, approximately 2 mm.

By way of polishing, dry-etching, or the like, the first substrate 11 is thinned to have a thickness in a range of, for example, 0.5 µm to 8 µm, preferably to be approximately 3 µm. (Hereinafter, the first substrate 11 after thinning may be indicated with a reference numeral 11a) Further, the shortest distance between a lower surface of the first substrate 11a and the active layer (in particular, a well layer) is preferably in a range of 2 µm to 9.5 µm. With such a distance, an emitted laser light is not easily emitted to the heat dissipating member, which will be described below.

Figure 1E:
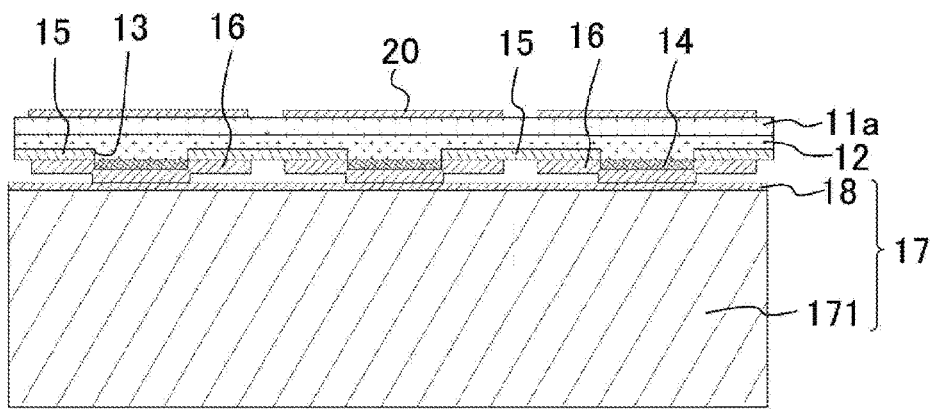
FIG. 1E is a schematic cross-sectional view illustrating the method of manufacturing the light emitting device according to the first embodiment.

After reducing a thickness (i.e., thinning) of the wafer, as shown in FIG. 1E, lower-surface electrodes 20 are preferably formed on a surface of the wafer obtained by the thinning (i.e., a surface of the first substrate 11a opposite to a surface thereof at the laser element structure side). The lower-surface electrodes 20 may be made of a material same as or different from that of the upper-surface electrodes, and/or have a layered structure same as or different from that of the upper-surface electrodes. The lower-surface electrodes 20 may have any appropriate thickness in accordance with, for example, a material used for lower-surface electrodes 20. The lower-surface electrodes can be made of, for example, a single-layer film or a layered film of a metal such as palladium, platinum, nickel, gold, titanium, tungsten, copper, silver, zinc, tin, indium, chromium, aluminum, iridium, rhodium or an alloy of two or more of these metals. The lower-surface electrodes 20 have a thickness in a range of, for example, 100 nm to 5 µm. In the case of completely removing the first substrate 11, the lower-surface electrodes 20 can be formed on a surface of the laser element structure at a side opposite to the second substrate 17.

In the case where the temporal substrate has been disposed, the temporal substrate is preferably removed after the lower-surface electrodes 20 are formed.

Figure 1F:
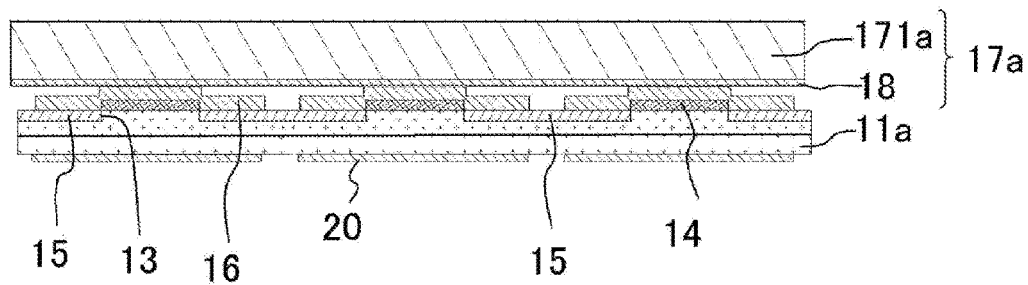
FIG. 1F is a schematic cross-sectional view illustrating the method of manufacturing the light emitting device according to the first embodiment.

Further, if necessary, as indicated by 17a in FIG. 1F, the second substrate 17 may be thinned to a predetermined thickness. Such thinning of the second substrate 17 to the second substrate 17a can facilitate singulation of the wafer in a later step. However, excessive thinning of the second substrate 17a would decrease handleability. Thus, the thickness of the second substrate 17a is preferably greater than a thickness of the wafer, exclusive of the second substrate 17a.

Singulating Wafer

Figure 1G:
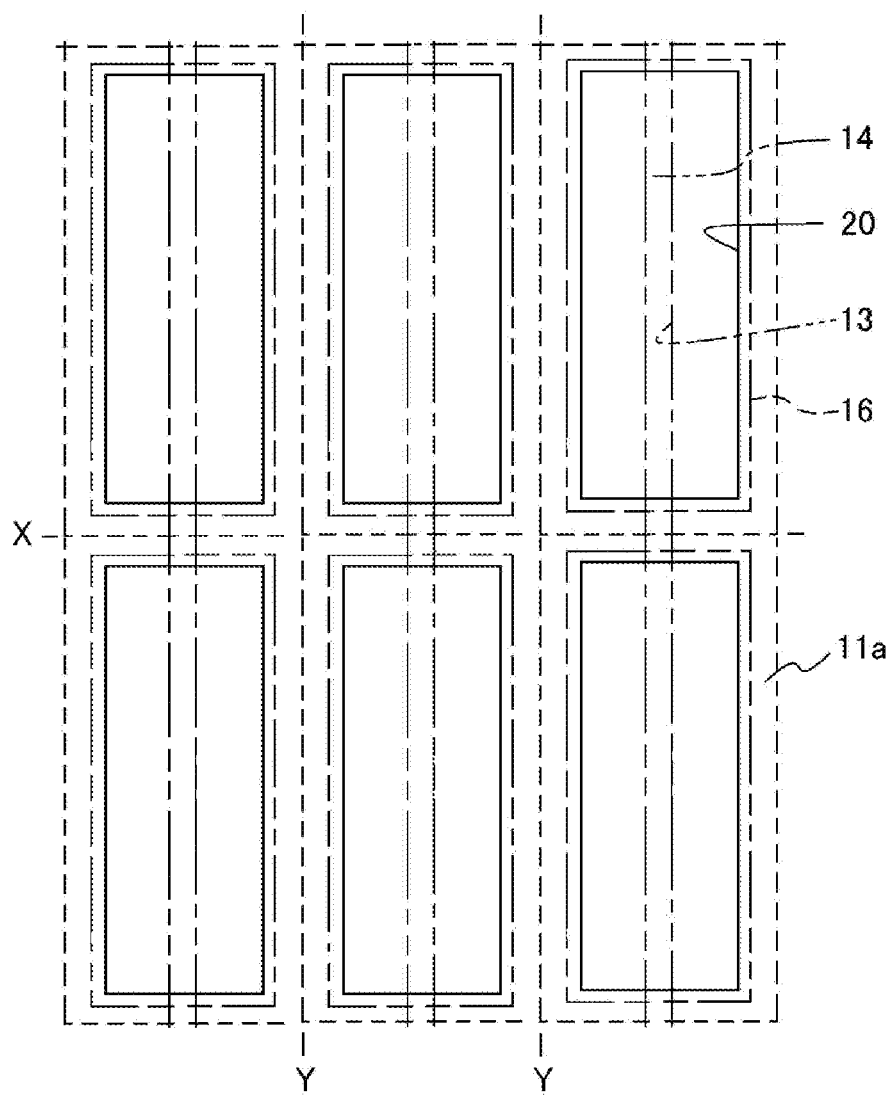
FIG. 1G is a schematic plan view illustrating the method of manufacturing the light emitting device according to the first embodiment.

After thinning the bonded wafer, the lower-surface electrodes 20 are optionally formed on the lower surface of the first substrate 11 or the like. Then, the bonded wafer is singulated. That is, the first substrate 11a (if the first substrate 11a is left), the laser element structure, and the second substrate 17a are singulated together. As shown in FIG. 1G, the singulation generally includes dividing in a direction to create an resonator end surface (i.e., dividing in X-direction) and dividing in a direction intersecting with the resonator, end surface (i.e., dividing in Y-direction). Either of the division in the X-direction and the division in the Y-direction may be performed earlier.

For example, grooves for division is formed at least one of the first substrate 11a and the second substrate 17a. In the case of forming the grooves in both the first substrate 11a and the second substrate 17a, the grooves are preferably formed so that the grooves in the first substrate 11a and the grooves in the second substrate 17a are aligned on the substantially same line in a plan view. When at least one of the first substrate 11a and the second substrate 12a contains an opaque material, it is difficult to align the grooves in the first substrate 11a and the grooves in second substrate 12a on the substantially same line in a plan view. Accordingly, it is preferable that the grooves are formed only in the second substrate 17a. With the first substrate 11a and the laser element structure respectively having a small thickness, forming grooves only in the second substrate 17a allows for dividing the wafer. This is similar in the case where the first substrate 11 is removed completely.

The grooves can be formed using a laser-scribing machine. Grooves may be formed in a form of lines or broken lines. In the case where the second substrate 17a (i.e., the main body 171a) has a cleavability, the grooves are preferably in a form of broken lines along an easy-cleavage plane. In the case where the grooves in a form of lines are formed to laterally extend in the wafer, the division tends to proceed in a zigzag direction or the like if the grooves do not completely correspond to the easy-cleavage plane. On the other hand, with the grooves in a form of broken lines, cleavage occurs at gaps of the broken lines of the grooves in a direction along the easy-cleavage plane even if the grooves do not completely correspond to the easy-cleavage plane. Instead of the grooves, division-starting region may be formed by performing internal laser processing.

After forming the grooves, the first substrate 11a and the second substrate 17a are cleaved together. The cleaving can be performed by applying a blade or the like on a surface of the wafer opposite to the surface of the wafer in which the grooves are formed.

The term "(a) direction intersecting the resonator end surface(s)" can refer to a direction intersecting the resonator end surface(s) at an angle in a range of approximately 90±1 degrees.

Figure 1H:
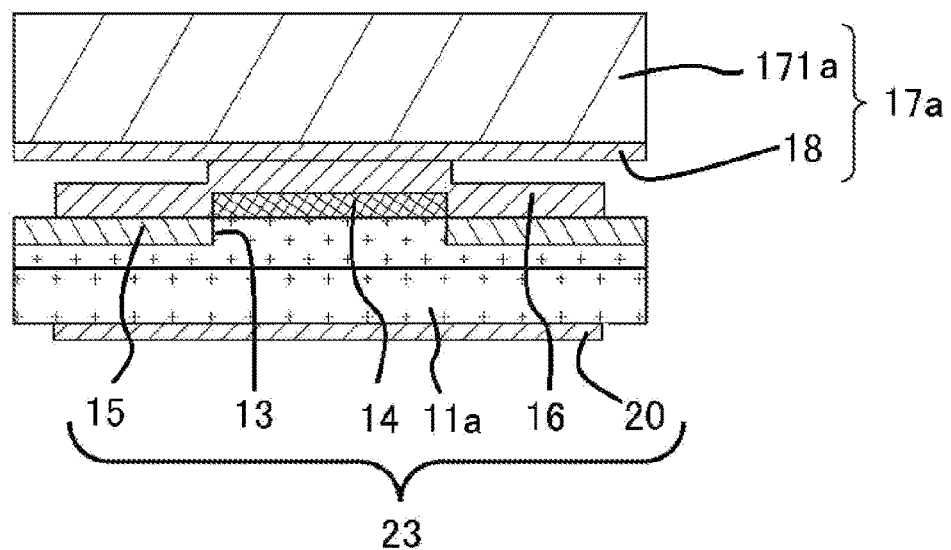
FIG. 1H is a schematic cross-sectional view illustrating the method of manufacturing the light emitting device according to the first embodiment.

By such division in the two directions, the water is singulated into a laser element 23 with the second substrate as shown in FIG. 1H.

After forming the resonator end surfaces, reflective mirrors are preferably formed on a surface at a light-emission, side and a surface at a light-reflection side, which is opposite to the light emission side, of the laser element 23 with the second substrate. For example, a first dividing step of forming the resonator end surfaces can be performed, a reflective-mirror forming step can be performed, and then a second dividing step of dividing in a direction intersecting the resonator end surfaces can be performed.

The reflective mirrors can be made of an oxide film, a nitride film, an oxynitride film, or a combination of two or more of these. Examples of the reflective mirrors include a dielectric multilayer film for which $SiO_2$, $ZrO_2$, $TiO_2$, $Al_2O_3$, $Nb_2O_5$, SiN, AlN, SiON, AlON or the like is used.

Mounting on Heat Dissipating Member

Figure 1I:
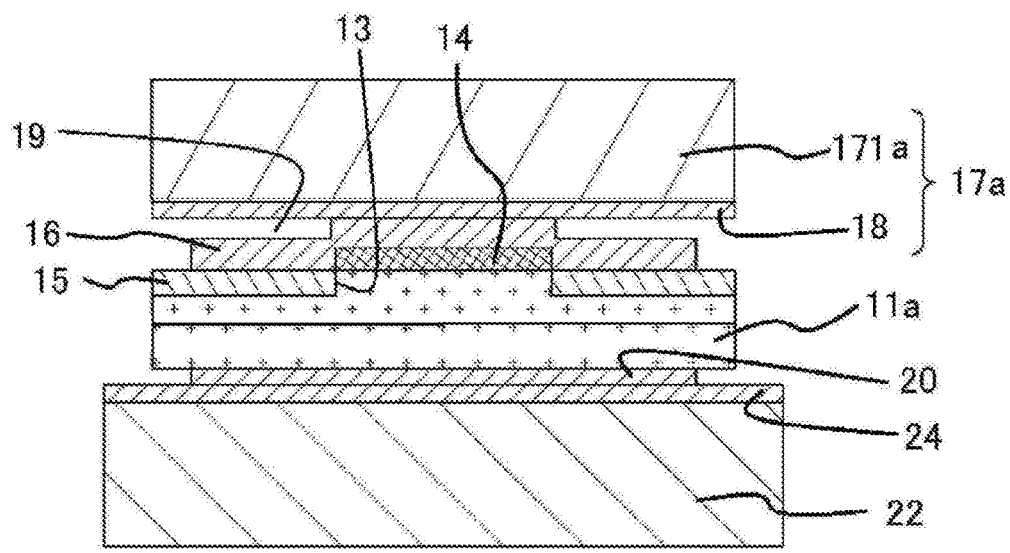
FIG. 1I is a schematic cross-sectional view illustrating the method of manufacturing the light emitting device according to the first embodiment.

In a state where the singulated laser element 23 is bonded to the second substrate 17a, the laser element 23 is mounted to the heat dissipating member 22 such that the lower-surface electrode 20 of the laser element 23 faces the heat dissipating member 22, as shown in FIG. 1I. That is, the laser element 23 with the second substrate 17a is mounted on the heat dissipating member 22 in a junction-up manner. Examples of the heat dissipating member 22 may include member containing SiC, AlN, or the like as a main material.

The mounting may be performed using, for example, using a conductive bonding material such as an AuSn-alloy solder.

Removing Second Substrate

Figure 1J:
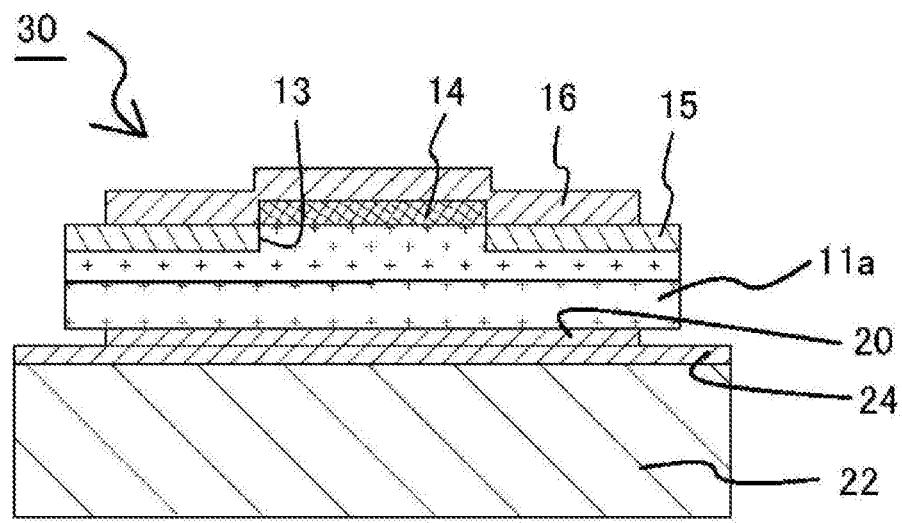
FIG. 1J is a schematic cross-sectional view illustrating the method of manufacturing the light emitting device according to the first embodiment.

After mounting the laser element 23 on the heat dissipating member 22, the second substrate 17a is pushed using a pushing jig, so that the second substrate 17a is separated from the laser element 23 to be removed as shown in FIG. 1J, and thus the laser element is obtained. In the case where the second metal layer 18 is disposed on the main body 171a, during the removing of the second substrate 17a, a portion or an entirety of the second metal layer 18 is removed. It is preferable that the pushing jig is applied only on the main body 171a of the second substrate 17a and is pushed. This allows for reducing damage to the laser element 23.

For example, a pushing jig used for a die shear strength testing machine can be used to push the second substrate 17a. For the pushing jig, a jig that can be brought into contact with the singulated laser element 23, and can apply a force in a direction substantially parallel to a contact surface between the second substrate 17a and the laser element 23 and, when the laser element 23 includes the ridge 13 at a surface thereof, also parallel to an extending direction of the ridge 13 is preferably used. If pushing is performed to move in a width direction of the ridge 13, the second substrate 17a may be inclined, which may damage the second p-electrode 16. On the other hand, pushing to move in an extending direction of the ridge 13 allows for reducing such damage. The force applied in the pushing is, for example, in a range of 2 N to 20 N. With a bonding strength that allows for causing separation when a force in this range is applied, erroneous detachment of the second substrate 17 in the step of thinning the wafer can be prevented, and breakage of the laser element 23 at the time of removing the second substrate 17 can also be prevented. The range of the force as described above is a preferable range of the force to be applied to a single ridge 13, and the force is preferably in a range in proportion to the number of the ridges 13 pressed at once. By such a physical separation, the upper-surface electrode (i.e., the second p-electrode 16) is exposed at a surface of the laser element 23 from which the second substrate 17a is separated.

In the case where the second substrate 17a and the laser element 23 are bonded together in a bonding manner that allows strong bonding such as a liquid phase diffusion bonding, the removal of the second substrate 17a can also be performed by heating or the like to reduce bonding strength of a bonded portion. However, heating at a temperature greater than 300° C. may lead to deterioration of the electrodes of the laser element 23 and the like, and accordingly a metal used for the bonded portion is limited to those having a melting point of 300° C. or less. Further, examples of such a metal having a low melting point include Sn, but if the bonded portion is made of Sn, an outermost surface of the laser element 23 after the removal is made of Sn, which requires heating again at the time of wire-bonding in order to improve adhesion between the outermost surface and a wire.

Accordingly, physical separation is preferably performed to remove the second substrate 17a. In other words, the second substrate 17a and the laser element 23 are bonded together with a bonding strength that allows physical separation between the second substrate 17a and the laser element 23. By a physical separation, the second substrate 17a and/or the laser element 23 can be moved in directions away from each other to remove the second substrate 17a from the laser element 23 without an additional step such as heating or immersing in an etching solution. This allows for preventing deterioration of the laser element 23 due to heating or the like. Such a physical separation is performed under a room temperature, for example.

Examples of such a physical separation include, as well as pushing with the use of the pushing jig or the like as described above, moving the second substrate 17a while holding the second substrate 17a by a clamp or the like, moving the second substrate 17a while suction-holding the second substrate 17a using an suction jig. When the clamp or the suction jig is used, the second substrate 17a can be lifted up, that is, the second substrate 17a may be moved in a direction perpendicular to a main surface of the laser element 23. When the second substrate 17a is held by a clamp or the like, the second substrate 17a may be rotated in a plan view.

With the removal of the second substrate 17 in such a manner, an amount of electric resistance corresponding to the second substrate 17a is eliminated, so that a driving voltage for applying a predetermined current can be reduced compared to the case where the second substrate 17a is present. Accordingly, wall-plug efficiency (WPE), which is a ratio of light output to inputted electric power, of a light emitting device 30 to be obtained can be improved. That is, efficiency of the light emitting device 30 can be increased. Further, because the second substrate 17 is removed, an inexpensive material can be used for the second substrate 17 irrespective of an electric resistance thereof.

After that, wire-bonding or the like is performed in the upper-surface electrode of the laser element 23 to provide an electrical conduction path, so that a voltage can be applied to the laser element 23. A wire having a diameter of 30 µm or greater, preferably 45 µm or greater, is used for the wire-bonding. Further, with a plurality of wires connected to a single laser element 23, a large current can be flown. The wire preferably has a thickness that allows for performing ball-bonding to the laser element 23. For example, the wire includes a ball portion having a diameter smaller than a width of the upper-surface electrode (i.e., a size of the second p-electrode 16 in a direction parallel to the resonator end surfaces).

Light Emitting Device

The light emitting device 30 obtained in the manner as described above includes the heat dissipating member 22 and the laser element 23, as shown in FIG. 1J. The laser element 23 includes the semiconductor layered structure 12, which is a laser element structure disposed on the first substrate 11a, an n-electrode, which is the lower-surface electrode 20 disposed on the lower surface of the first substrate 11a, and the first p-electrode 14 and the second p-electrode 16, which are included in the upper-surface electrode disposed on the upper surface of the semiconductor layered structure 12. The heat dissipating member 22 faces the n-electrode, and is bonded to the laser element 23 via a bonding, member 24 such as an AuSn-alloy solder.

Thinning or completely removing the first substrate 11a allows the light emitting portion of the laser element 23 to be located closer to the heat dissipating member 22, which allows heat to be easily released to the heat dissipating member 22, so that heat resistance of the laser element 23 can be reduced. Further, with the laser element 23 mounted on the heat dissipating member 22 so that a side opposite to the ridge 13 faces the heat dissipating member 22, a material having a high heat resistance such as an insulating film is not necessarily disposed between the laser element 23 and a submount, so that heat resistance of the laser element 23 can be further reduced compared to the case where the laser element 23 is mounted in a junction-down.

Even further, with the thinned first substrate 11a that is remained, the light emitting portion is easily located apart from the heat dissipating member 22 compared to the case where the first substrate 11 is eliminated. Accordingly, the light emission end surface may be located outward of the heat dissipating member 22, or a distance between the light emission surface and the heat dissipating member can be reduced. Accordingly, heat dissipation performance from the laser element 23 to the heat dissipating member 22 can be improved.

As described above, removing the second substrate 17a allows for reducing electric resistance as a whole of the light emitting device 31, and thus driving voltage can be reduced. Accordingly, efficiency of the light emitting device can be increased. The light emitting device 30 is particularly suitable for the case where the laser element 23 has a high output, which tends to generate a large quantity of heat. The expression "high output" as used herein refers to, for example, an output in a range of 1 W to 50 W.

Example 1

Method of Manufacturing Light Emitting Device Providing Wafer

As shown in FIG. 1A, a semiconductor layered structure 12 in which an n-side semiconductor layer, an active layer, and a p-side semiconductor layer are disposed in this order was formed on a +c plane of a GaN substrate of φ50.8 mm serving as a first substrate 11. In Example 1, a nitride semiconductor layer represented by a general formula $In_XAl_YGa_{1-X-Y}N$ ($0 \leq X$, $0 \leq Y$, $X+Y \leq 1$) was used for each of the n-side semiconductor layer, the active layer, and the p-side semiconductor layer. Subsequently, stripe-shaped ridges 13 (each having a width of 35 µm and a height of 270 nm) were formed at an upper surface side of the p-side semiconductor layer.

Next, as shown in FIG. 1B, first p-electrodes 14 made of an ITO film having a width of 32 µm and a thickness of 200 nm were formed on a substantially entirety of an upper surface of a respective one of the ridges 13. Subsequently, insulating films 15 each having a thickness of 200 nm and made of $SiO_2$ were formed on portions of the upper surface of the p-side semiconductor layer except for the upper surface a each of the ridges 13. Subsequently, second p-electrodes 16 each having a layered structure of Ni/Pd/Au/Pt/Au with thicknesses of 8 nm/200 nm/400 nm/200 nm/700 nm, respectively, were formed respectively over an timer surface of a corresponding one of the first p-electrodes 14 and corresponding ones of the insulating films 15 to be electrically connected to the corresponding one of the first p-electrodes 14.

Bonding Wafer to Second Substrate

An Si substrate with a planar orientation of (100), electrical resistivity of 0.005 Ω·cm or less, and a thickness of 400 µm was provided as a second substrate 17. As used herein, the expression "an Si substrate with a planar orientation of (100)" as used herein refers to an Si substrate having a main surface with a planar orientation of (100). The second substrate 17 includes a Pt/Au film (having thicknesses of 200 nm/700 nm, respectively), which is formed using a sputtering device and serves as a second metal film 18, on a surface of second substrate 17.

The Au layer, which is the uppermost layer of the second metal layer 18, and the Au layer, which is the uppermost layer at each of the second p-electrodes 16, which is a portion of each of upper-surface electrodes of the laser element structure of the wafer, were heat-pressure bonded at 7 kN and 280° C. to brat a metal bond (Au—Au heat-pressure bond). Accordingly, the wafer was bonded to the second substrate 17. Because physical separation can be preformed in a later step, in this bond, the second metal layer 18 and the second p-electrodes 16 are considered to be not melted together and an interface therebetween is considered to be not eliminated but maintained. Also, after performing physical separation in a later step, irregularities due to separation at the bonded portion were observed in an upper surface of a protruding portion of the second p-electrode 16 attributed to a shape of the ridge 13, but not at both, sides of the protruding, portions were observed to be flat. Accordingly, in a bonded state, gaps 19 are considered to be present at both sides of the protruding portion.

At the time of bonding the wafer and the second substrate 17 were aligned so that a line parallel to a (−110) plane of the Si substrate, which is the second substrate 17, when viewed from above the (−110) plane of the Si substrate and a line parallel to a (1-100) plane, which is an m-plane, of the first substrate 11 of the wafer when viewed from above the m-plane of the first substrate 11 of the wafer are parallel to each other.

Thinning Wafer

As shown in FIG. 1D, a portion of the first substrate 11 in a thickness direction was removed to thin the wafer. In more detail, in order to reduce warpage of the wafer at the time of thinning the first substrate 11, a second substrate 17 side of the wafer was temporally bonded to a sapphire substrate with a thickness of 2 mm using a wax, and the first substrate 11 was polished so as to have a thickness of approximately 5 µm. At this time, CMP was used to finish the polishing. An in-plane distribution of a thickness of the bonded wafer after thinning was within ±1.0 µm in a substrate of φ50.8 mm.

Forming Lower-Surface Electrode

As shown in FIG. 1E, Ti/Pt/Au layered films (with thicknesses of 6 nm/200 nm/300 nm, respectively) were formed on a polished surface of the thinned first substrate 11a (at an n-side semiconductor layer side) using a sputtering apparatus, so that n-electrodes as lower surface electrodes 20 were formed.

Subsequently, the sapphire substrate that had been temporally bonded was removed. Next, a first substrate 11a side of the wafer was temporally bonded with a sapphire substrate having a thickness of 2 mm using a wax in a manner similar to that as described above, and the second substrate 17 having a thickness of 400 μm was polished to become a second substrate 17a having a thickness of 75 μm as shown in FIG. 1F. By this polishing, the second substrate 17 can be thinned to have a thickness appropriate for cleavage during singulation in a later step. After that, the sapphire substrate that had been temporally bonded was removed.

Singulating Wafer

Grooves were formed in the obtained second substrate 17a with a bonded structure at cleavage-planned positions thereof using a laser-scribing machine. One of the cleavage-planned positions is indicated by a broken line X in FIG. 1G. Also, grooves were formed in an end portion of the first substrate 11a along the cleavage-planned positions using a laser-scribing machine.

After forming the grooves, the first substrate 11a and the second substrate 17a were cleaved along the grooves using a breaking apparatus, so that resonator end surfaces of laser elements were formed.

Then, a dielectric multilayer film was formed on each of the resonator end surfaces, and a substrate with a bonded structure obtained by cleaving to form the resonator end surfaces was singulated into a plurality of chips by cutting in a direction perpendicular to the resonator end surfaces, that is, in a direction indicated b broken lines Y in FIG. 1G, using a breaking machine. Thus, a laser element 23 was obtained as shown in FIG. 1H.

Mounting on Heat Dissipating Member

As shown in FIG. 1I, the singulated laser element 23 that has been bonded to the second substrate 17a was mounted on the heat dissipating member 22 made of mainly SiC via a bonding member 24 made of AuSn-alloy solder with a lower-surface electrode 20 side of the laser element 23 faces the heat dissipating member 22 side. The heat dissipating member 22 includes a base portion made of SiC and a conductive layer disposed on a surface of the base portion. The conductive layer and the lower-surface electrode 20 were electrically connected together via the bonding member 24.

Removing Second Substrate

In a state where the laser element 23 was mounted on the heat dissipating member 22, the second substrate 17a bonded to the laser element 23 was pushed using a pushing jig with a force of 5N in a resonator direction, so that the second substrate 17a was separated from the laser element 23 and removed, as shown in FIG. 1J. Separation was performed at the interface between Au of the outermost surface of the laser element 23 (i.e., the uppermost layer of the second p-electrode 16) and Au of the outermost surface of the second metal layer 18 in the second substrate 17a, so that substantially no damage was observed in the laser element 23 after separation.

Then, wire-bonding was performed on the second p-electrode 16 of the laser element 23 and the conductive layer of the heat dissipating member 22, so that a light emitting device 30 to which electricity can be supplied was obtained.

Evaluation of Light Emitting Device: Reduction in Thermal Resistance

Figure 4:
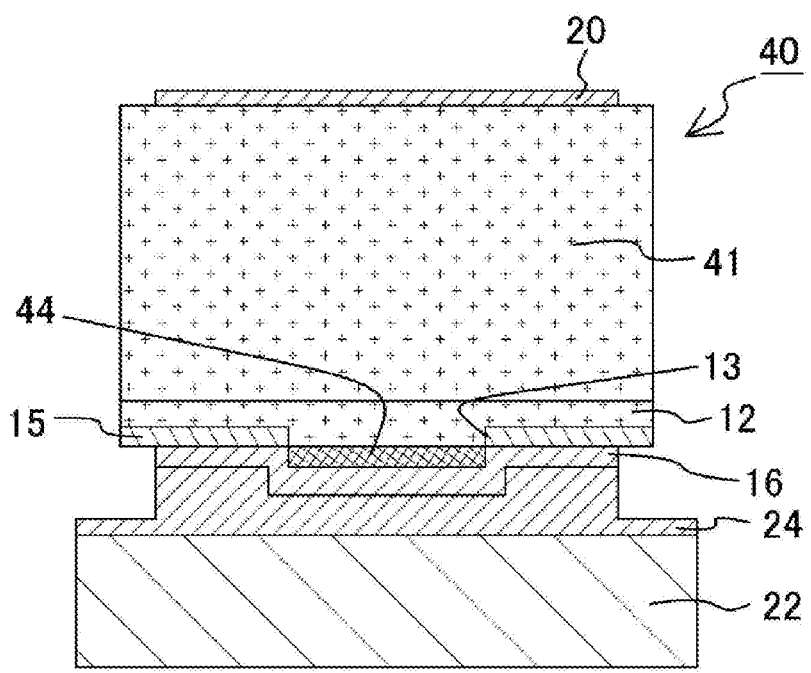
FIG. 4 is a schematic cross-sectional view showing a light emitting device according to a comparative example.

The light emitting device 30 of Example 1 was mounted on a package. For a comparison, a light emitting device 40 of Comparative Example 1 was provided as described below, and mounted on a package. Transient thermal resistances of the light emitting device 30 and the light emitting device 40 were measured using a heating method (i.e., dynamic method). The light emitting device 40 of Comparative Example 1 was provided with a structure similar to that of the light emitting device 30 of Example 1 except that a laser element of the light emitting device 40 had a substrate 41 with a thickness of 80 μm, which was greater than a thickness of the first substrate 11a, and a laser element was mounted in a junction-down manner. As shown in FIG. 4, the laser element of the light emitting device 40 of Comparative Example 1 included a semiconductor layered structure 12 at a first main surface side of the substrate 41, and had a stripe-shaped ridge 13 as in the laser element 23 of Example 1. An electrode similar to the n-electrode 20 of the laser element 23 of Example 1 was disposed at a second main surface side opposite to the first main surface side of the substrate 41. Further, a first p-electrode 44, insulating films 15, and a second p-electrode 16 that were similar to those in Example 1 were disposed on a surface of the semiconductor layered structure 12. The laser element having the configuration described above was mounted in a junction-down manner on a heat dissipating member 22 that was similar to that in Example 1 via a bonding member 24 made of an AuSn-alloy solder.

According to a result of measurement of the transient thermal resistance, the laser element 23 of the light emitting device 30 of Example 1 had a heat resistance approximately 0.6° C./W lower than that of the laser element of the light emitting device 40 of Comparative Example 1.

This is considered, in the light emitting device 40 of Comparative Example 1, a first p-electrode 14 (ITO film with a thermal conductivity of 8 W/(m·K)) and the insulating film 15 (SiO$_2$ film with a thermal conductivity of 1 W/(m·K)) each having a lower thermal conductivity were present between an optical waveguide part (i.e., a portion near an active layer of the ridge 13), which is a heat source, and a submount; meanwhile, in the laser element 23 of Example 1, the n-electrode 20 (Ti/Pt/Au, where Ti layer has a thermal conductivity of 17 W/(m·K), Pt layer has a thermal conductivity of 70 W/(m·K), and Au layer has a thermal conductivity of 320 W/(m·K)) is present between the optical waveguide part and the submount, resulting in a low heat resistance value.

Evaluation of Light Emitting Device: Reduction in Voltage

Current and voltage were measured on a light emitting device including a laser element to which a second substrate 17a with a thickness of 75 μm (i.e., Comparative Example 2) had been bonded and the light emitting device 30 including the laser element 23 from which the second substrate 17a was removed in a manner described above (i.e., Example 1) while performing Continuous oscillation. A second substrate 17a of the light emitting device of Comparative Example 2 included a main body 171a that is an Si substrate with an electrical resistance of 0.005 Ω·cm or less.

Figure 2:
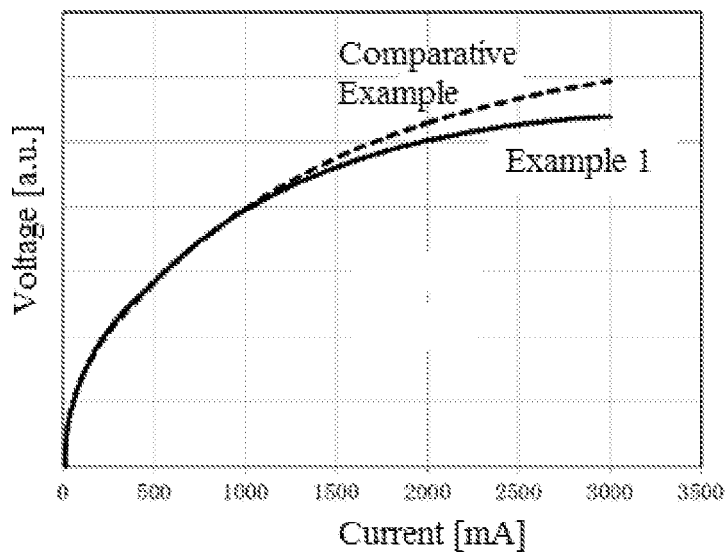
FIG. 2 is a graph showing a voltage-current curves of the laser device according to the first embodiment and a laser device of Comparative Example.

The results are shown in FIG. 2.

FIG. 2 shows that the light emitting device 30 of Example 1, from which the second substrate 17a was removed, could be supplied with electricity in a state where wires were connected to a surface of the light emitting device 30 where the second substrate 17a had been bonded. FIG. 2 further shows that a voltage on the light emitting device 30 of Example 1 was smaller than that on the light emitting device of Comparative Example 2 (more specifically, a voltage at 3.0 A on the light emitting device 30 was 0.11 V smaller than that on the light emitting device of Comparative Example 2). This attributed to an effect of reduction in voltage due to elimination of electric resistance caused by removal of the second substrate 17a.

Example 2

Method of Manufacturing Light Emitting Device

In Example 2, as shown in FIG. 3B, a raising layer 31 subjected to an appropriate patterning is further formed on each of the ridges (between a respective one of the first p-electrodes 14 and a respective one of the second p-electrodes 16) in the step of providing the element-structure wafer as in Example 1.

Accordingly, a portion of an outermost layer of the respective one of the second p-electrodes 16 under which the patterned raising layer is formed is located highest in the laser element 23, and can be mainly mounted to the second metal layer 18 of the second substrate. Thus, a bonding area (i.e., bonding strength) can be adjusted by the patterning.

Further, in Example 2, the light emitting device is manufactured in a manner similar to that in Example 1 except for the step described above, so that an effect of reducing heat resistance and reducing voltage can be expected as in Example 1.

It is to be understood that although the present invention has been described with regard to certain embodiments thereof, various other embodiments and variants may occur to those skilled in the art, which are within the scope and spirit of the invention, and such other embodiments and variants are intended to be covered by the following claims.

What is claimed is:

1. A method of manufacturing a light emitting device, the method comprising:
    providing an element-structure wafer having a first substrate and a laser element structure on the first substrate;
    bonding a laser element structure side of the element-structure wafer to a second substrate to obtain a bonded wafer;
    removing at least a portion of the first substrate to obtain a thinned bonded wafer;
    singulating the thinned bonded wafer to obtain a laser element with the second substrate;
    mounting the laser element with the second substrate on a heat dissipating member such that a laser element side of the laser element with the second substrate faces the heat dissipating member; and
    removing the second substrate from the laser element.

2. The method of manufacturing the light emitting device according to claim 1, wherein
    the bonding of the laser element structure side of the element-structure wafer to the second substrate is performed by using a bonding method that allows physical separation, and
    the removing of the second substrate from the laser element is performed by physical separation.

3. The method of manufacturing the light emitting device according to claim 1, wherein
    the providing of the element-structure wafer includes providing the element-structure wafer having the laser element structure having ridges on a side opposite to the first substrate.

4. The method of manufacturing the light emitting device according to claim 3, wherein
    the bonding of the laser element structure side of the element-structure wafer to the second substrate includes bonding the element-structure wafer and the second substrate at portions where the ridges are formed in a plan view while the element-structure wafer and the second substrate are not bonded with each other at portions other than the portions where the ridges are formed in the plan view.

5. The method of manufacturing the light emitting device according to claim 2, wherein
    the providing of the element-structure wafer includes forming a first metal layer on an outermost surface of the laser element structure on a side opposite to the first substrate, and
    the bonding of the laser element structure side of the element-structure wafer to the second substrate includes
    providing the second substrate having a main body and a second metal layer disposed on an outermost surface on a main surface side of the main body, and
    bonding the first metal layer of the element-structure wafer to the second metal layer of the second substrate, while maintaining an interface between the first metal layer of the element-structure wafer and the second metal layer of the second substrate.

6. The method of manufacturing the light emitting device according to claim 5, wherein
    the providing of the element-structure wafer includes forming the first metal layer so that the first metal layer constitutes at least a portion of each of electrodes of the laser element structure.

7. The method of manufacturing the light emitting device according claim 1, wherein
    the bonding of the laser element structure side of the element-structure wafer to the second substrate includes bonding the element-structure wafer to the second substrate such that an easy-cleavage plane of the first substrate and an easy-cleavage plane of the second substrate are parallel to each other when viewed from the laser element structure side or a second substrate side.

8. The method of manufacturing the light emitting device according to claim 1, wherein
    the providing of the element-structure w includes providing an GaN substrate as the first substrate and providing a nitride semiconductor layer as the laser element structure, and
    the bonding of the laser element structure side of the element-structure wafer to the second substrate includes providing an Si substrate as the second substrate.

9. The method of manufacturing a light emitting device according to claim 1, wherein
    the removing of the second substrate from the laser element is performed by pushing the second substrate.

10. The method of manufacturing the light emitting device according to claim 9, wherein
    the providing of the element-structure wafer includes providing the element-structure wafer having the laser element structure having ridges extending in an extending direction on a side opposite to the first substrate.

11. The method of manufacturing the light emitting device according to claim 10, wherein
the removing of the second substrate from the laser element includes pushing the second substrate to move the second substrate in the extending direction of the ridges.

12. The method of manufacturing the light emitting device according to claim 10, wherein
the bonding of the laser element structure side of the element-structure wafer to the second substrate includes bonding the element-structure wafer and the second substrate at portions where the ridges are formed in a plan view while the element-structure wafer and the second substrate are not bonded with each other at portions other than the portions where the ridges are formed in the plan view.

13. The method of manufacturing the light emitting device according to claim 9, wherein
the bonding of the laser element structure side of the element-structure wafer to the second substrate includes bonding the element-structure Wafer and the second substrate by a metal bonding technique.

14. The method of manufacturing the light emitting device according to claim 13, wherein
the bonding of the laser element structure side of the element-structure wafer to the second substrate is performed under conditions in which a temperature of the bonding is 200° C. to 300° C., a force of the bonding is 3 kN to 10 kN, and duration of the bonding is 5 minutes to 15 minutes.

15. The method of manufacturing the light emitting device according to claim 9, wherein
the providing of the element-structure wafer includes forming a first metal layer on an outermost surface of the laser element structure on a side opposite to the first substrate, and
the bonding of the laser element structure side of the element-structure wafer to the second substrate includes
providing the second substrate having a main body and a second metal layer disposed on an outermost surface on a main surface side of the main body, and
bonding the first metal layer of the element-structure wafer to the second metal layer of the second substrate by the metal bonding technique.

16. The method of manufacturing the light emitting device according to claim 15, wherein
the providing of the element-structure wafer includes forming the first metal layer so that the first metal layer constitutes at least a portion of each of electrodes of the laser element structure.

17. The method of manufacturing the light emitting device according to claim 9, wherein
the providing of the element-structure wafer includes providing an GaN substrate as the first substrate and a nitride semiconductor layer as the laser element structure, and
the bonding of the laser element structure side of the element-structure wafer to the second substrate includes providing an Si substrate as the second substrate.

18. The method of manufacturing a light emitting device according to claim 1, wherein
the removing of the second substrate from the laser element is performed by lifting the second substrate while holding the second substrate by a clamp or a suction jig.

* * * * *